(12) United States Patent
Wang et al.

(10) Patent No.: US 9,887,183 B2
(45) Date of Patent: Feb. 6, 2018

(54) POWER MODULE WITH THE INTEGRATION OF CONTROL CIRCUIT

(71) Applicant: DELTA ELECTRONICS, INC., Taoyuan (CN)

(72) Inventors: Tao Wang, Taoyuan (CN); Zhenqing Zhao, Taoyuan (CN); Zeng Li, Taoyuan (CN); Kai Lu, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 10 days.

(21) Appl. No.: 15/151,730

(22) Filed: May 11, 2016

(65) Prior Publication Data

US 2017/0012030 A1 Jan. 12, 2017

(30) Foreign Application Priority Data

Jul. 9, 2015 (CN) .......................... 2015 1 0400779

(51) Int. Cl.
*H01L 25/16* (2006.01)
*H01L 23/00* (2006.01)
(Continued)

(52) U.S. Cl.
CPC .......... *H01L 25/162* (2013.01); *H01L 23/053* (2013.01); *H01L 23/49833* (2013.01); *H01L 23/49838* (2013.01); *H01L 24/32* (2013.01); *H01L 24/49* (2013.01); *H01L 24/73* (2013.01); *H01L 23/24* (2013.01); *H01L 2224/29139* (2013.01); *H01L 2224/29147* (2013.01); *H01L 2224/32225* (2013.01); *H01L 2224/45014* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01);
(Continued)

(58) Field of Classification Search
None
See application file for complete search history.

(56) References Cited

U.S. PATENT DOCUMENTS 5,530,623 A * 6/1996 Sanwo .................... H05K 1/14
361/784
5,629,839 A * 5/1997 Woychik ................ H05K 3/366
361/784
(Continued)

*Primary Examiner* — Michael Lebentritt
*Assistant Examiner* — Jordan Klein
(74) *Attorney, Agent, or Firm* — Yunling Ren

(57) ABSTRACT

The present disclosure provides a power module with the integration of a control circuit at least, including: a power substrate; a power device mounted on the power substrate; and at least one control substrate which supports the control circuit, is electrically connected with the power substrate and disposed at an angle of inclination on a surface of the power substrate on which the power device is mounted; wherein the angle of inclination is greater than or equal to 45 degrees and smaller than or equal to 135 degrees. In the power module provided by the present disclosure, only the power substrate as well as the connections between the control substrate and the power substrate occupies the footprint area of the power module, and thus the horizontal footprint area of the power module is effectively reduced and thereby the power density of the power module is increased.

10 Claims, 32 Drawing Sheets

(51) Int. Cl.
*H01L 23/053* (2006.01)
*H01L 23/31* (2006.01)
*H01L 23/498* (2006.01)
*H01L 25/07* (2006.01)
*H01L 23/24* (2006.01)

(52) U.S. Cl.
CPC ............ *H01L 2224/48106* (2013.01); *H01L 2224/48227* (2013.01); *H01L 2224/48472* (2013.01); *H01L 2224/4903* (2013.01); *H01L 2224/73265* (2013.01); *H01L 2224/85205* (2013.01); *H01L 2224/85801* (2013.01); *H01L 2924/00011* (2013.01); *H01L 2924/01004* (2013.01); *H01L 2924/0132* (2013.01); *H01L 2924/0133* (2013.01); *H01L 2924/01046* (2013.01); *H01L 2924/01047* (2013.01); *H01L 2924/01078* (2013.01); *H01L 2924/01079* (2013.01); *H01L 2924/0532* (2013.01); *H01L 2924/05032* (2013.01); *H01L 2924/05042* (2013.01); *H01L 2924/05432* (2013.01); *H01L 2924/1205* (2013.01); *H01L 2924/1207* (2013.01); *H01L 2924/12035* (2013.01); *H01L 2924/13023* (2013.01); *H01L 2924/13055* (2013.01); *H01L 2924/13091* (2013.01); *H01L 2924/1426* (2013.01); *H01L 2924/15724* (2013.01); *H01L 2924/15738* (2013.01); *H01L 2924/15747* (2013.01); *H01L 2924/15763* (2013.01); *H01L 2924/19041* (2013.01); *H01L 2924/19107* (2013.01)

(56) References Cited

U.S. PATENT DOCUMENTS

| | | | | |
|---|---|---|---|---|
| 5,747,875 | A * | 5/1998 | Oshima | H01L 25/16 257/687 |
| 6,304,448 | B1 * | 10/2001 | Fukada | H05K 7/209 174/16.3 |
| 7,706,146 | B2 * | 4/2010 | Lee | H01L 25/165 361/752 |
| 2001/0038143 | A1 * | 11/2001 | Sonobe | H01L 24/49 257/690 |
| 2002/0060356 | A1 * | 5/2002 | Nishibori | H01L 23/049 257/668 |
| 2003/0067065 | A1 * | 4/2003 | Lee | H01L 23/49575 257/691 |
| 2006/0267705 | A1 * | 11/2006 | Schumacher | H01P 3/06 333/1 |
| 2007/0183130 | A1 * | 8/2007 | Yamabuchi | H05K 7/1432 361/728 |
| 2011/0101515 | A1 * | 5/2011 | Beaupre | H01L 24/49 257/691 |
| 2012/0319260 | A1 * | 12/2012 | Kim | H01L 23/4334 257/676 |
| 2014/0152373 | A1 * | 6/2014 | Romas, Jr. | H01L 25/18 327/374 |

\* cited by examiner

POWER MODULE WITH THE INTEGRATION OF CONTROL CIRCUIT

CROSS-REFERENCE TO RELATED APPLICATIONS

This application claims priority to Chinese Patent Application No. 201510400779.0, filed Jul. 9, 2015, the entire contents of which are incorporated herein by reference.

TECHNICAL FIELD

The present disclosure generally relates to a power module, and more particularly, to a high power density power module with the integration of a control circuit at least.

BACKGROUND

Conventional power modules with the integration of driving control circuits usually include power devices, a power substrate at least supporting the power device, control devices constituting the driving control circuit and control substrates supporting the driving control circuit. FIGS. 1A and 1B are schematic diagrams illustratively showing two conventional power modules with the integration of driving control circuits, respectively. As shown in FIG. 1A, power devices 11 are interconnected onto a power substrate 12 via a solder. The power devices 11 are for example power semiconductor chips, and the power substrate 12 is for example a Direct Bonded Copper (DBC) substrate. Control devices 13 include, for example, driving devices for controlling the power device 11, driving resistors and capacitors and some other devices such as diodes and the like. The control devices 13 are disposed on a control substrate 14, such as, a Printed Circuit Board (PCB). some electrical connections are realized by the conductive traces on the power substrate 12 and the control substrate 14, and in addition, other parts of the electrical connections between power loops and signal loops and electrical connections between the control substrate 14 and the power substrate 12 are also realized by using wiring bonding technologies such as metal wires 36, for example, thick aluminum wires, golden wires, and the like. The conductive traces on the power substrate 12 and the control substrate 14, and the metal wires 36 achieve all the electrical connections for the power devices 11 and the control devices 13 in the power module. The power substrate 12 is lower than the control substrate 14 for the convenience in achieving good mechanical contacts between the bottom of the power substrate 12 and a heat radiator so as to realize heat radiation of the power device 11. The power module as shown in FIG. 1B only employs one substrate 15, for example, an Insulated Metal Substrate (IMS). Both the power devices and the control devices 13 are interconnected onto the substrate 15. Both the power modules as shown in FIGS. 1A and 1B occupy relatively large footprint areas because both the power devices 11 and the control devices 13 are horizontally arranged on respective substrates.

Other conventional power modules with the integration of a control circuit include a power device, a power substrate supporting the power device, a decoupling capacitor, a diode, and a control substrate supporting the decoupling capacitor and the diode. FIG. 2 is a schematic diagram showing a power module with the integration of a control circuit which includes a decoupling capacitor and a diode. As shown in FIG. 2, a power device 11 is interconnected onto a power substrate 12 via a solder. The power substrate 11 is for example a power semiconductor chip, and the power substrate 12 is for example a DBC substrate. A decoupling capacitor 23 and a diode 23' are disposed on a control substrate 14 which is for example a PCB. Some electrical connections are realized by the conductive traces on the power substrate 12 and the control substrate 14, and in addition, other parts of the electrical connections between power loops and signal loops and electrical connections between the control substrate 14 and the power substrate 12 are realized by using wires 36. The conductive traces on the power substrate 12 and the control substrate 14, and the metal wires 36 achieve all the electrical connections for the power devices 11 and the control devices 13 in the power module. Similarly to the power modules as shown in FIGS. 1A and 1B, the power module as shown in FIG. 2 also occupies a relatively large footprint area.

SUMMARY

In view of the above, the present disclosure provides a high power density power module with the integration of a control circuit at least in order to effectively reduce the horizontal footprint area occupied by the power module.

Additional aspects and advantages of the present disclosure will be explained in part in the following descriptions, and a part of them will become clear from the following descriptions, or may be appreciated by practice of the present disclosure.

The present provides a power module with the integration of a control circuit at least, including:

a power substrate;

a power device mounted on the power substrate; and at least one control substrate which supports the control circuit, is electrically connected with the power substrate and disposed at an angle of inclination on a surface of the power substrate on which the power device is mounted;

wherein the angle of inclination is greater than or equal to 45 degrees and smaller than or equal to 135 degrees.

In the power module provided by the present disclosure, only the power substrate and the connections between the control substrate and the power substrate occupy the horizontal footprint areas, and thus the horizontal footprint areas occupied by the power module are effectively reduced and thereby the power density of the power module is increased. In other embodiment, the power module provided by the present disclosure may reduce the power consumption and voltage stress of the power semiconductor devices and thereby the reliability and efficiency of the power module can be improved.

BRIEF DESCRIPTION OF THE DRAWINGS

The above and other features and advantages of the present disclosure will become clearer from detailed descriptions of exemplary embodiments with reference to drawings.

DETAILED DESCRIPTION

Now, exemplary implementations will be described more comprehensively with reference to the accompanying drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to the ordinary skills in this art.

The features, structures or characteristics described herein may be combined in one or more embodiments in any suitable manner. In the following descriptions, many specific details are provided to facilitate sufficient understanding of the embodiments of the present disclosure. However, one of ordinary skills in this art will appreciate that the technical solutions in the present disclosure may be practiced without one or more of the specific details, or by employing other methods, components, materials and so on. In other conditions, well-known structures, materials or operations are not shown or described in detail so as to avoid confusion of respective aspects of the present disclosure.

Figure 1A:
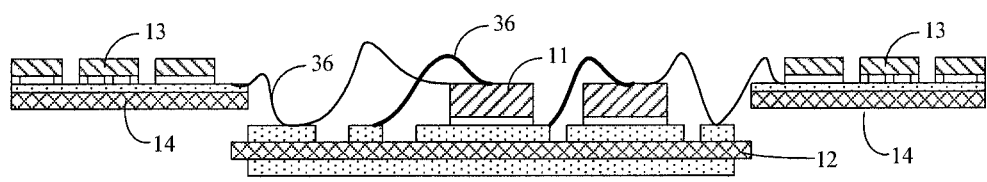
FIGS. 1A and 1B are schematic diagrams showing two conventional power modules with the integration of driving control circuits, respectively.
Figure 1B:
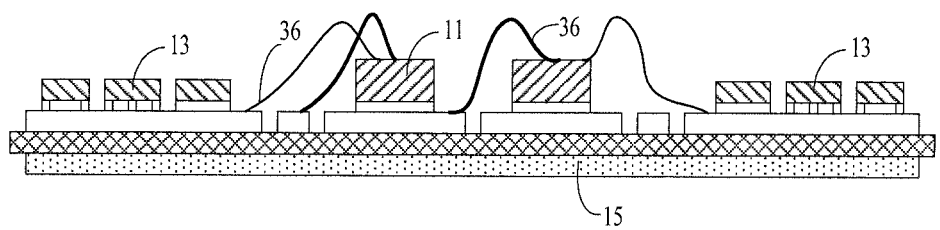
Figure 2:
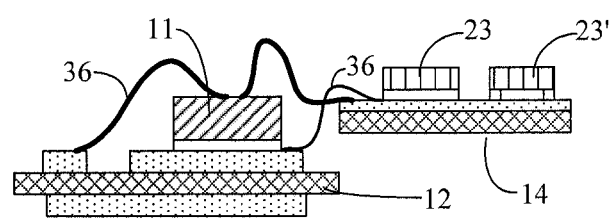
FIG. 2 is a schematic diagram showing a conventional power module with the integration of a control circuit which includes a decoupling capacitor.
Figure 3:
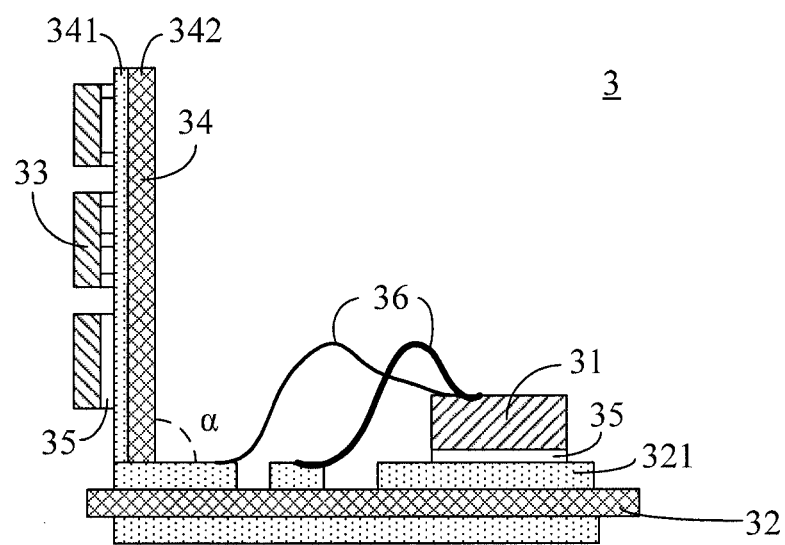
FIG. 3 is a side view of a power module with the integration of a control circuit according to an exemplary embodiment.

FIG. 3 is a side view of a power module with the integration of a control circuit according to an exemplary embodiment. As shown in FIG. 3, the power module 3 includes a power device 31, a power substrate 32, a control device 33 and a control substrate 34. The power device 31 is mounted on the power substrate 32. The control substrate 34 supports the control circuit formed by the control devices 33 and is electrically connected with the power substrate 32. The power substrate 32 is horizontally disposed. The control substrate 34 is disposed on one surface of the power substrate 32 on which the power device 31 is mounted, vertically to the power substrate 32. The control circuit formed by the control device 33 is used for controlling the power device 31. The power substrate 32 includes at least one conductive wiring layer 321. The power device 31 is disposed on the conductive wiring layer 321. The control substrate 34 includes at least one conductive wiring layer 341 and at least one insulation layer 342. The control device 33 is disposed on the conductive wiring layer 341. The power device 31 and the control device 33 are both interconnected to the conductive wiring layer 321 of the power substrate 32 and the conductive wiring layer 341 of the control substrate 34 via a bonding material 35. A connection structure 36 at the top of the power device 31 realizes the electrical connection with the power substrate 32. It can be seen from the structure that in this structure, only the power substrate as well as the connections between the control substrate 54 and the power substrate 32 occupy the footprint area of the module.

The power substrate 32 is horizontally disposed for the convenience of being mounted onto a heat radiator (not shown) for heat dissipation. The power substrate 32 may be a DBC substrate. Further, the power substrate 32 may also be Direct Bonded Aluminum (DBA) ceramic substrate, a Low Temperature Co-fired Ceramic (LTCC) substrate, a Direct Plated Copper (DPC) substrate, an Insulated Metal Substrate (IMS), a PCB, a Lead Frame (LF) and the like.

The control substrate 34 may be a PCB. Also, the control substrate 34 may also be substrates of other types except LF.

The power device 31 may be a power semiconductor chip such as IGBT, a MOSFET, an IGCT (Integrated Gate Commutated Thyristor) and the like.

The conductive wiring layers 321 and 341 of the power substrate 32 and the control substrate 34 include materials such as golden, silver, copper, copper-aluminum composition material, golden-platinum, palladium-golden, palladium-silver, platinum-silver and palladium-copper-silver and the like. The insulation layer 342 includes ceramic such as $Al_2O_3$, AlN, $Si_3N_4$, BeO and the like, or may be an organic material such as epoxy material or silicon-based material.

The above bonding material 35 may be a solder, an Inter-metallic Compound (IMC), or may include a low temperature co-fire material (for example, a material capable of being fired at a low temperature for connection between a chip and a substrate, such as silver or copper solder paste), a conductive silver adhesive, and the like.

The connection structure 36 at the top of the power device 31 may be realized by wire bonding technologies or wire free bonding technologies. The wire bonding technologies realize electrical connections by ultrasonic bonding using materials such as aluminum wires, copper wires, aluminum-copper composite wires or golden wires, and the like. The wire free bonding technologies include Al ribbon bonding, metal-metal direct bonding, Cu Clip bonding. The Al ribbon bonding technology is realized by ultrasonic bonding, the metal-metal direct bonding technology employs a ultrasonic soldering process using metal such as Ag, Cu, Al, Au, and the like, the Cu Clip bonding technology employs bonding materials to realize electrical connections between the cooper clip and the chip and the conductive wiring layer of the substrate, and the bonding materials may include solder, low temperature co-fire materials (for example materials capable of being fired at a low temperature for connections between a chip and a substrate, such as silver or copper solder paste), conductive silver adhesives, and the like.

Figure 4A:
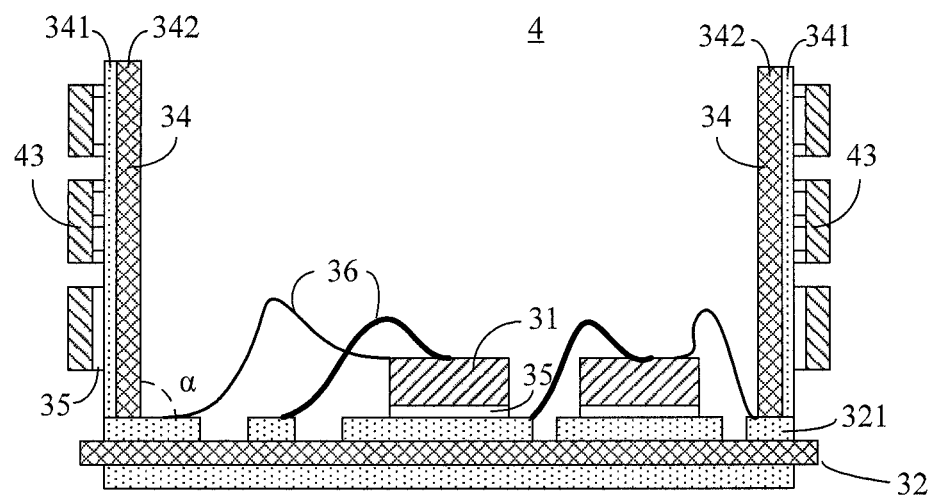
FIGS. 4A to 4C are schematic diagrams showing a half-bridge IGBT power module with the integration of driving control circuits according to an exemplary embodiment.
Figure 4B:
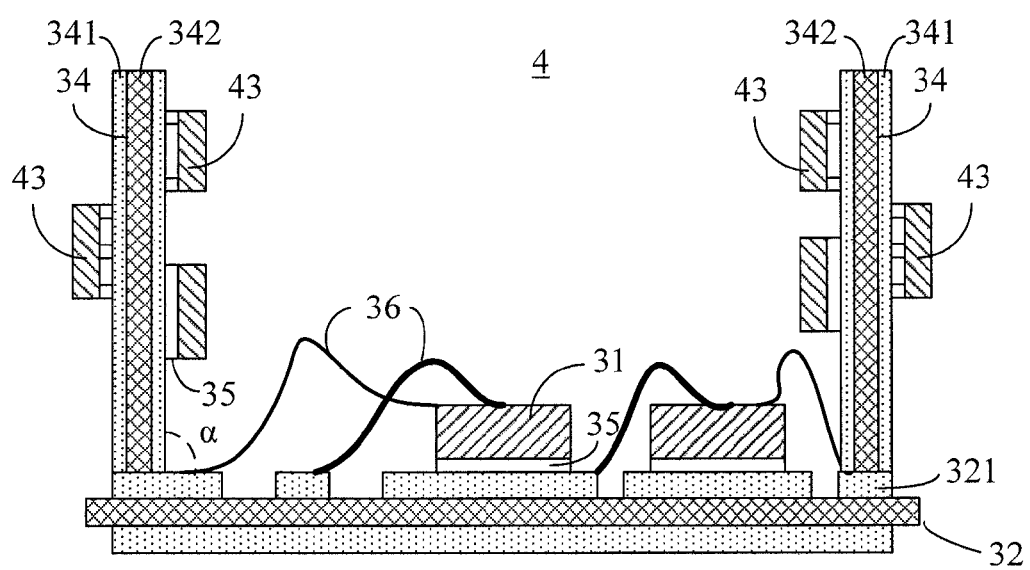
Figure 4C:
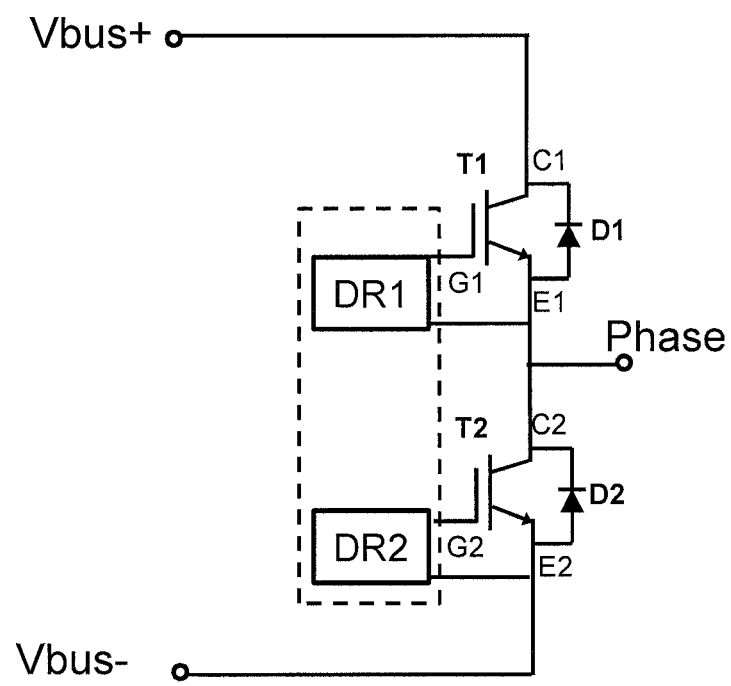

FIGS. 4A to 4C are schematic diagrams showing a half-bridge IGBT power module with the integration of a driving control circuit according to an embodiment. FIG. 4A is a side view showing a configuration when control devices are disposed on driving control substrates with single conductive layer. FIG. 4B is a side view showing a configuration when control devices are disposed on driving control substrates with two conductive layers, and FIG. 4C is a circuit topology of the power module. As shown in FIGS. 4A to 4C, the power module 4 includes power devices 31, control devices 43, a power substrate 32 and control substrates 34. Each power device 31 includes one IGBT chip (T1 or T2) and one diode (D1 or D2). The control devices 43 include driving devices for controlling the power devices 31. The control devices 43 are placed on the control substrates 34 to form driving units DR1 and DR2 for driving the IGBT chips T1 and T2, respectively.

The control devices 43 include a driving element, a driving chip, a zener diode, an optocoupler, a capacitor, a resistor, and/or a diode, and the like. The driving control substrates can be also designed with multi-conductive layers.

As shown in the topology in FIG. 4C, the power IGBT chips T1 and T2 are connected in series and are in reverse parallel connection with diodes D1 and D2. A collector C1 of T1 is connected to Vbus+, and an emitter E1 is connected to a collector C2 of T2 and a terminal named Phase. An emitter E2 of T2 is connected to Vbus−. The driving unit DR1 is connected between a gate G1 and the emitter E1 of the IGBT chip T1. The driving unit DR2 is connected between a gate G2 and the emitter E2 of the IGBT chip T2.

Specifically, the bottoms (i.e., the collectors) of the IGBT chips T1 and T2 are connected to the terminals Vbus+ and Phase on the conductive wiring layer 321 of the power substrate 32 via a bonding material 35. The top emitters of the IGBT chips T1 and T2 are connected to the terminals Phase and Vbus− on the conductive wiring layer 321 via a top connection structure 36. The top gates of the power chips T1 and T2 are connected to the gates G1 and G2 on the conductive wiring layer 321 via the top connection structure 36 so as to realize electrical connections. The control substrates 34 having the driving units DR1 and DR2 are vertically disposed on the power substrate 32 and are electrically connected to the terminals G1, E1 and G2, E2 on the conductive wiring layer 321.

The control devices 43 constituting the driving units DR1 and DR2 are interconnected onto the conductive wiring layer 341 of the control substrate 34. The conductive wiring layer 341 could be single conductive layer (as shown in FIG. 4A), or two conductive layers (as shown in FIG. 4B) or multi-conductive layers.

Figure 5A:
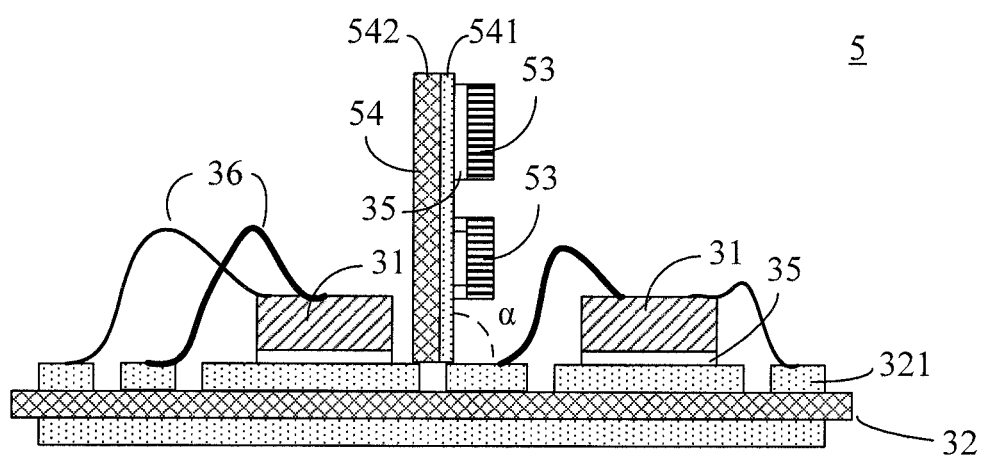
FIGS. 5A to 5D are schematic diagrams showing an IGBT power module with the integration of a control circuit which includes a decoupling capacitor according to an exemplary embodiment.
Figure 5B:
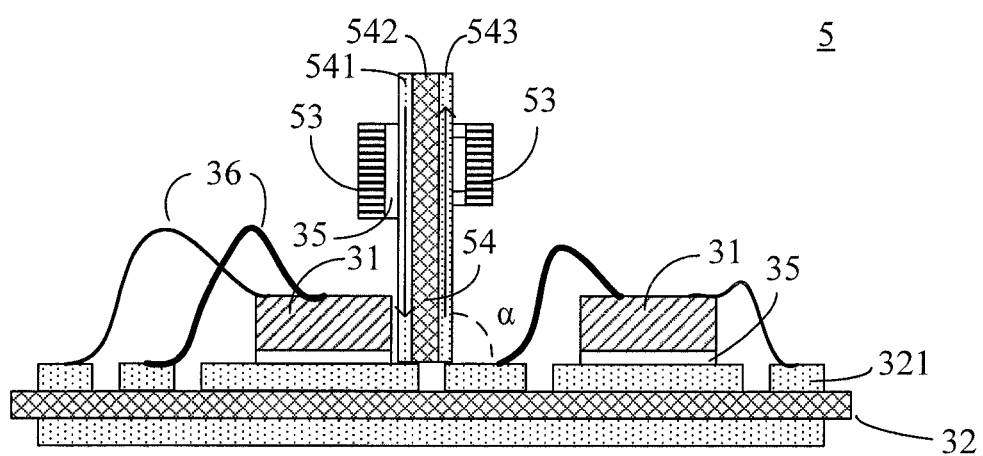
Figure 5C:
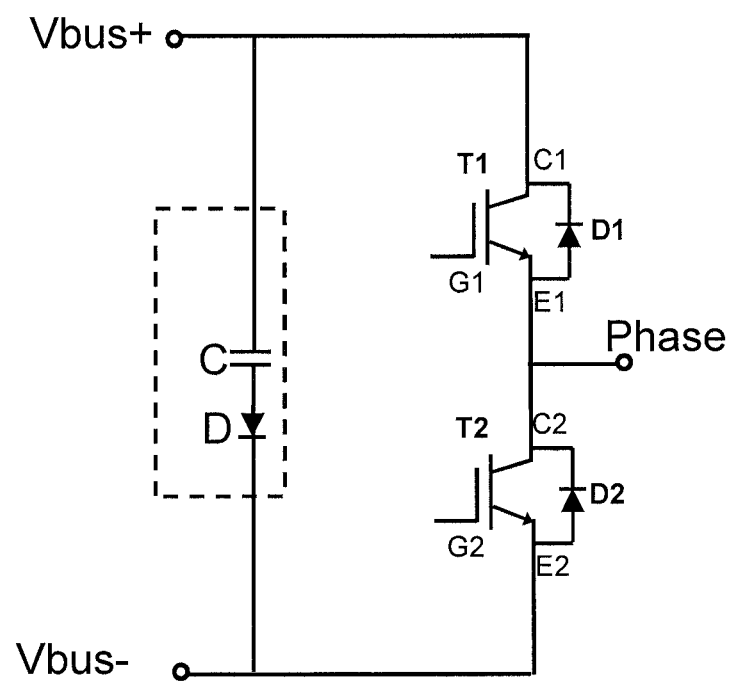
Figure 5D:
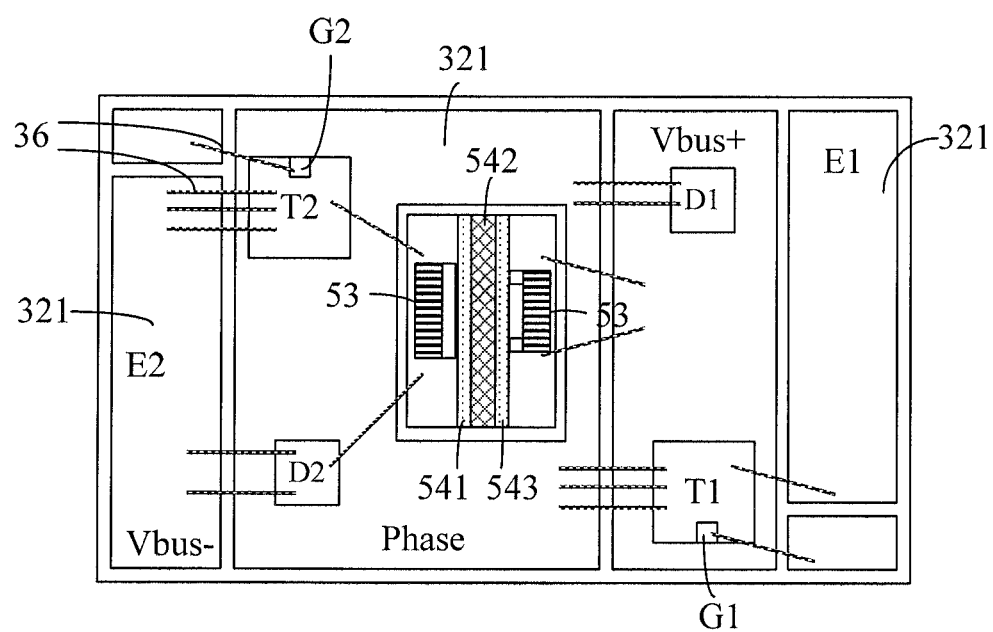

FIGS. 5A to 5D are schematic diagrams showing an IGBT power module with the integration of a control circuit which includes a decoupling capacitor according to an embodiment. FIG. 5A is a side view showing a configuration when control devices are disposed on a driving control substrate with single conductive layer, FIG. 5B is a side view showing a configuration when control devices are disposed on a driving control substrate with two conductive layers, FIG. 5C is a circuit topology of the power module, and FIG. 5D is a top view of FIG. 5B. As shown in FIGS. 5A to 5D, the power module 5 includes power devices 31, a power substrate 32, control devices 53 and a control substrate 54. Each power device 31 includes a power IGBT chip (T1 or T2) and a diode chip (D1 or D2), and the control devices 53 constituting the control circuit include a decoupling capacitor C and a diode D. Optionally, the control substrate 54 may be of the same type as that of the control substrate 34, and repeated descriptions are omitted here.

As shown in the topology in FIG. 5C, the power IGBT chips T1 and T2 are connected in series, and are in reverse parallel connection with the diodes D1 and D2. A collector C1 of T1 is connected to Vbus+, and an emitter E1 is connected to a collector C2 of T2 and a terminal named Phase. An emitter E1 of T2 is connected to Vbus−. The control circuit includes a series circuit formed by a capacitor C and a diode D typically, and is connected in parallel at two terminals of the series branch composed of the power IGBT chips T1 and T2. One terminal of the decoupling capacitor C is connected with an anode of the diode D, and the other terminal is connected with the terminal Vbus+, and a cathode of the diode is connected to the terminal Vbus−.

Specifically, as shown in FIGS. 5A, 5B and 5D, the control substrate 54 at least includes a conductive wiring layer 541 and an insulation layer 532. The collectors of the IGBT chips T1 and T2 are packaged to the terminals Vbus+ and Phase on the conductive wiring layer 321 of the power substrate 32 via a bonding material 35. The top emitters of the power chips T1 and T2 are connected to the terminals Phase and Vbus− on the conductive wiring layer 321 via a top connection structure 36, respectively. The top gates of the power chips T1 and T2 are connected to the gates G1 and G2 on the conductive wiring layer 321 via the top connection structure 36 so as to realize electrical connections. The control devices 53 in the control circuit are interconnected onto the conductive wiring layer 541 of the control substrate 54. The control substrate 54 is vertically disposed onto the power substrate 32, and is electrically connected to the terminals G1, E1 and G2, E2 on the conductive wiring layer 321.

The control devices 53 include a capacitor, a resistor, an IGBT, a MOSFET, and/or a diode, and the like.

As shown in the side view in FIG. 5B, the control substrate 54 with the control devices 53 may further include another conductive wiring layer 543, and the insulation layer 542 of the control substrate 54 may be disposed between the two conductive wiring layers 541 and 543. When the power devices 31 work, the current flowing directions through the conductive wiring layer 541 and the conductive wiring layer 543 are opposite. Thus, an inverse coupling electromagnetic field may be formed between the conductive wiring layers 541 and 543 so as to further reduce the parasitic inductance in the main loop. The parasitic inductance of the two conductive wiring layers 541 and 543 are in reverse proportion with the overlapping area of the two conductive wiring layers 541 and 543. The larger the overlapping area is, the smaller the parasitic inductance will be. The parasitic inductance of the two conductive wiring layers 541 and 543 are in proportion with the distance between the two conductive wiring layers. The smaller the distance is, the smaller the parasitic inductance will be.

Figure 6A:
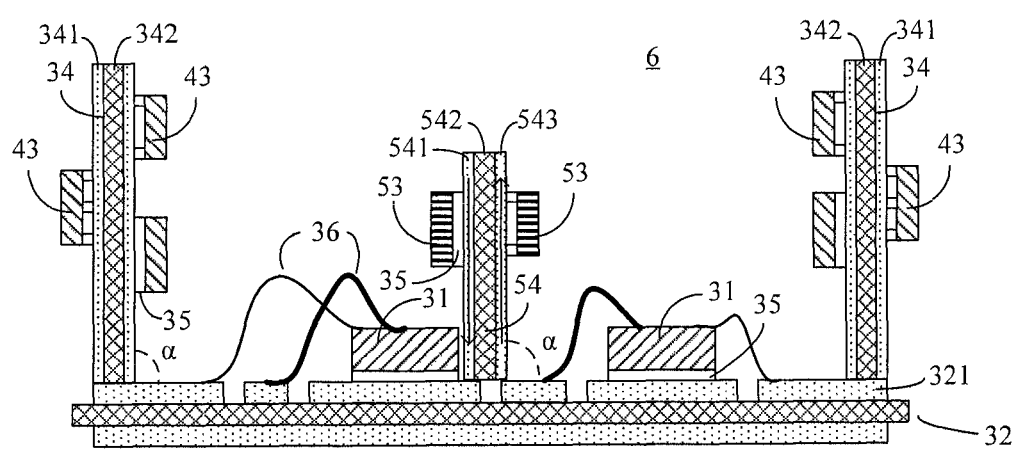
FIGS. 6A to 6B are schematic diagrams showing an IGBT power module with the integration of driving control circuits and a control circuit which includes a decoupling capacitor according to an exemplary embodiment.
Figure 6B:
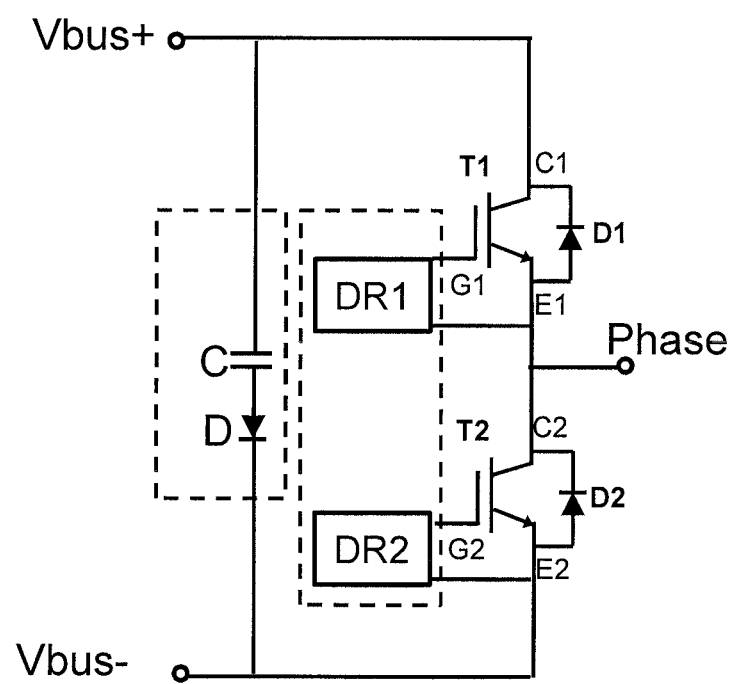

FIGS. 6A and 6B are schematic diagrams showing an IGBT power module with the integration of both a driving control circuit and a control circuit which includes a decoupling capacitor. FIG. 6A is a side view of the power module, and FIG. 6B is a circuit topology of the power module. As shown in FIGS. 6A and 6B, the power module 6 includes power devices 31, a power substrate 32, control devices 43 constituting driving control circuits, control devices 53 constituting control circuits which include a decoupling capacitor, control substrates 34 for supporting the driving control circuits, and a control substrate 54 for supporting the control circuits which includes the decoupling capacitor. The control substrates 34 and the control substrate 54 are vertically disposed onto the power substrate 32. Only the power substrate 32 as well as the connections between the control substrate 54 and the power substrate 32 occupies the horizontal footprint areas of the power module.

The parasitic inductance between the conductive wiring layer 541 and the conductive wiring layer 543 of the control substrate 54 is in proportion with the distance between the two layers, i.e., the smaller the thickness of the insulation layer 542 of the control substrate 54 is, the smaller the parasitic inductance will be. However, the thickness of the insulation layer 542 is limited to material processing: the smaller the thickness of the insulation layer 542 is, the more difficult the processing will be. In view of the above, the thickness of the insulation layer 542 may be selected as within a range from 5 μm to 2 mm. The thicknesses of the conductive wiring layers 541 and 543 relate to the on-current, the processing limits and the costs. The conductive wiring layers 541 and 543 of a greater thickness can withstand greater on-current, and accordingly may lead to higher costs. Further, due to the processing limits, the thicknesses of the conductive wiring layers 541 and 543 have to be within a manufacturable range. In view of the above, the thicknesses of the conductive wiring layers 541 and 543 are selected as with a range from 5 μm to 2 mm.

In addition, although the control substrate is vertically disposed onto the power substrate in the above embodiments, the control substrate may be disposed on the power substrate at an angle of inclination α in order to further reduce the height of the power module and increase the power density. For example, the angel of inclination α is required to be within a range from 45 degrees to 135 degrees.

The power module provided by embodiments of the present disclosure may have other control circuits integrated in addition to the above types of control circuits. FIGS. 7A to 7D show circuit topologies of IGBT power modules with the integration of different control circuits.

Figure 7A:
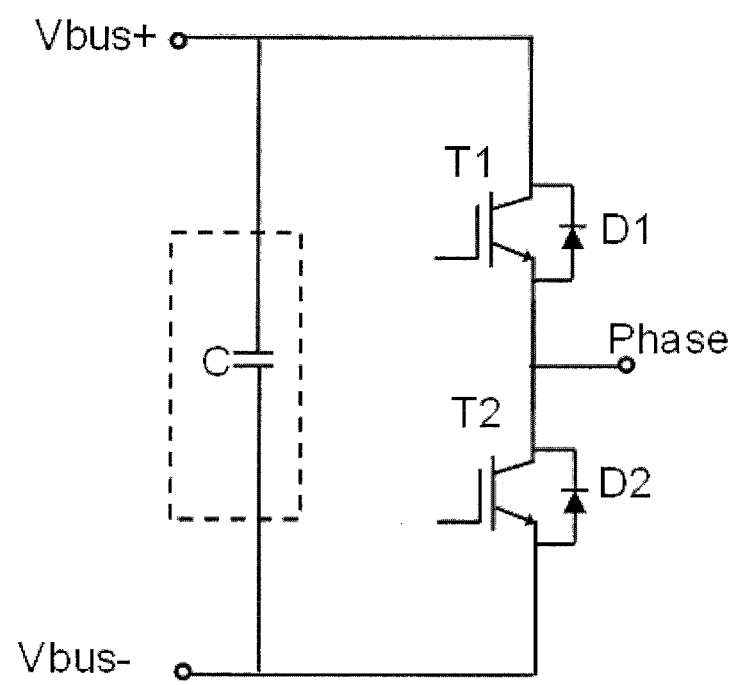
FIGS. 7A to 7D are circuit topologies of IGBT (diodes are not shown) power modules with the integration of different control circuits according to exemplary embodiments, respectively.

As shown in FIG. 7A, as compared with the circuit topology in FIG. 5C, the control circuit 7a only includes a decoupling capacitor C, two terminals of which are connected to terminals Vbus+ and Vbus−, respectively. The decoupling capacitor C is only disposed on the conductive wiring layer 541 or 543 of the control substrate 54.

Figure 7B:
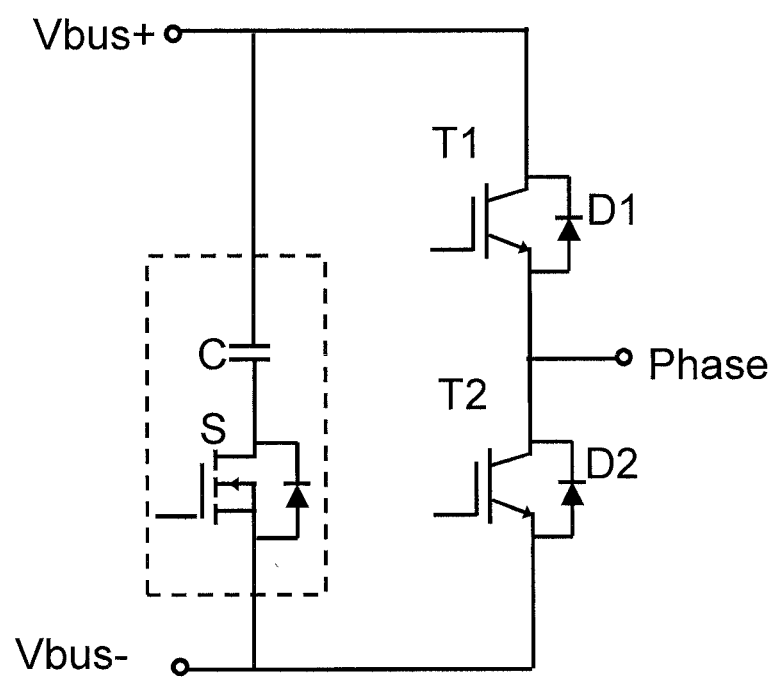

FIG. 7B is a circuit topology of a half-bridge power circuit with an active clamp element. The difference between FIG. 7B and FIG. 5C is that the diode D is replaced with a MOSFET S. The capacitor C and MOSFET S in the control circuit 7b may be disposed on both of the conductive wiring layer 541 and the conductive wiring layer 543 of the control substrate 54, or may be only disposed on one of the conductive wiring layer 541 and the conductive wiring layer 543. One terminal of the decoupling capacitor C is connected with a drain electrode of the MOSFET S, the other terminal of the decoupling capacitor C is connected with a terminal Vbus+, and a source electrode of the MOSFET S is connected to a terminal Vbus−.

Figure 7C:
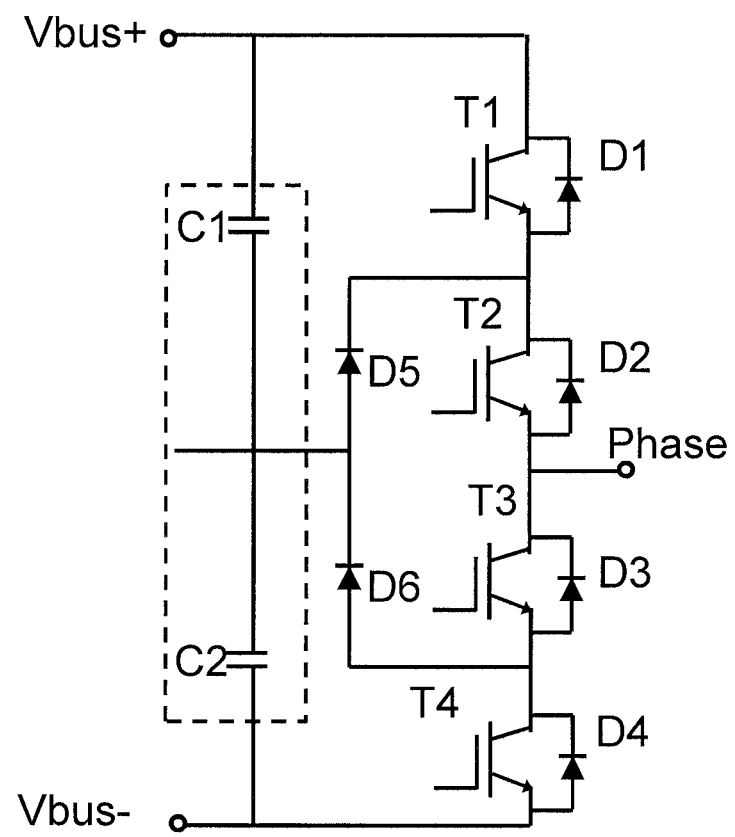

FIG. 7C is a circuit topology of a D type three-level power module with an absorption capacitor. As shown in FIG. 7C, power devices 31 include power chips T1, T2, T3 and T4, diodes D1, D2, D3 and D4 in parallel with the chips T1, T2, T3 and T4, and diodes D5 and D6. The control circuit 7c includes capacitors C1 and C2. The power chips T1~T4 are connected in series, the diodes D5 and D6 are connected in series, a cathode of D5 is connected to a collector of T2, and an anode of D6 is connected to an emitter of T3. A branch formed by serially connected T1, T2, T3 and T4 is connected in parallel with a branch formed by serially connected C1 and C2. A branch formed by serially connected diodes D5 and D6 is connected in parallel with the branch formed by serially connected T2 and T3. A common connection point of C1 and C2 is connected with a common connection point of D5 and D6.

For the structure as shown in FIG. 7C, the package structure as shown in FIG. 5A of the present disclosure may be employed, i.e., the power chips (T1~T4, D1~D2, D5 and D6) are disposed on the conductive wiring layer 321 of the power substrate 32. The absorption capacitors C1 and C2 are disposed on the conductive wiring layer 541 of the control substrate 54. Also, the package structure in FIG. 5B may be employed, i.e., both of the capacitors C1 and C2 may be disposed on the conductive wiring layer 541 or 543, or the capacitors C1 and C2 may be disposed on the conductive wiring layers 541 and 543, respectively. For the loop formed by T1, D5 and C1, the capacitor C1 may reduce the voltage surge between the collector of T1 and the anode of D5 during switching on and off. When T1 is turned on and D5 is turned off, the capacitor C1 is used to reduce the voltage between the two electrodes of D5. When D5 is turned on and T1 is turned off, the capacitor C1 is used for reducing the voltage between the collector and the emitter of T1. For the loop formed by T4, D6 and C2, the capacitor C2 may reduce the voltage surge between the emitter of T4 and the cathode of D6. When T4 is turned on and D6 is turned off, the capacitor C2 is used for reducing the voltage between the two electrodes of D6. When D6 is turned on and T4 is turned off, the capacitor C2 is used for reducing the voltage between the collector and emitter of T4.

Figure 7D:
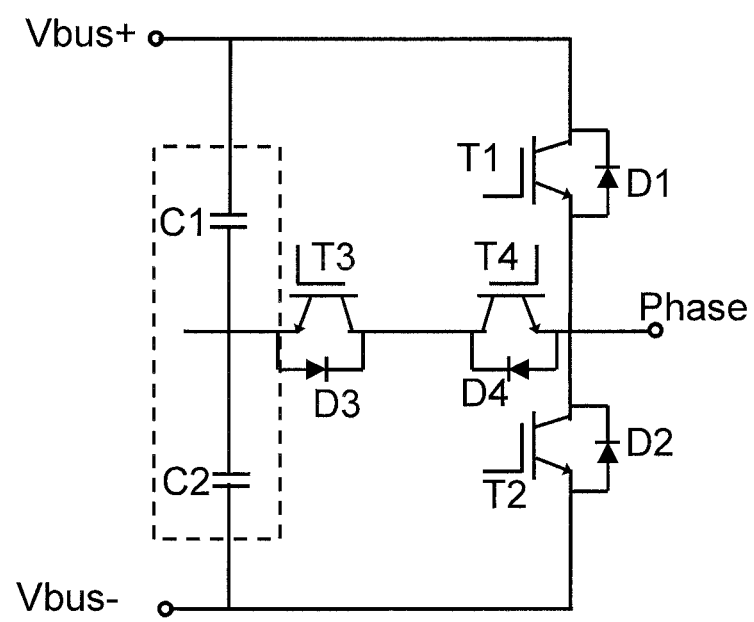

FIG. 7D is a circuit topology of a T type three-level power module with an absorption capacitor. As shown in FIG. 7D, the power devices 31 include power chips T1, T2, T3 and T4, and diodes D1, D2, D3 and D4 in parallel with the power chips T1, T2, T3 and T4. A control circuit 7d includes capacitors C1 and C2. The power chips T1 and T2 are connected in series, the branch formed by serially connected T1 and T2 is connected with the branch formed by serially connected capacitors C1 and C2. The power chips T3 and T4 are connected in series, the branch formed by serially connected T3 and T4 is connected between a common point of the serially connected C1 and C2 and a common point of the serially connected T1 and T2.

For the structure as shown in FIG. 7D, the package structure as shown in FIG. 5A of the present disclosure may be employed, i.e., the power chips are disposed on the conductive wiring layer 321 of the power substrate 32, and the absorption capacitors C1 and C2 are disposed on the conductive wiring layer 541 of the control substrate 54. Also, the package structure in FIG. 5B may also be employed, i.e., both C1 and C2 are disposed on the conductive wiring layer 541 or 543, or C1 and C2 may also be disposed on the conductive wiring layers 541 and 543, respectively.

In the power module provided by the present disclosure, only the power substrate as well as the connections between the control substrate and the power substrate occupies horizontal footprint areas of the power module, and thus the horizontal footprint areas occupied by the power module are effectively reduced, and thereby power density of the power module is increased.

Figure 8:
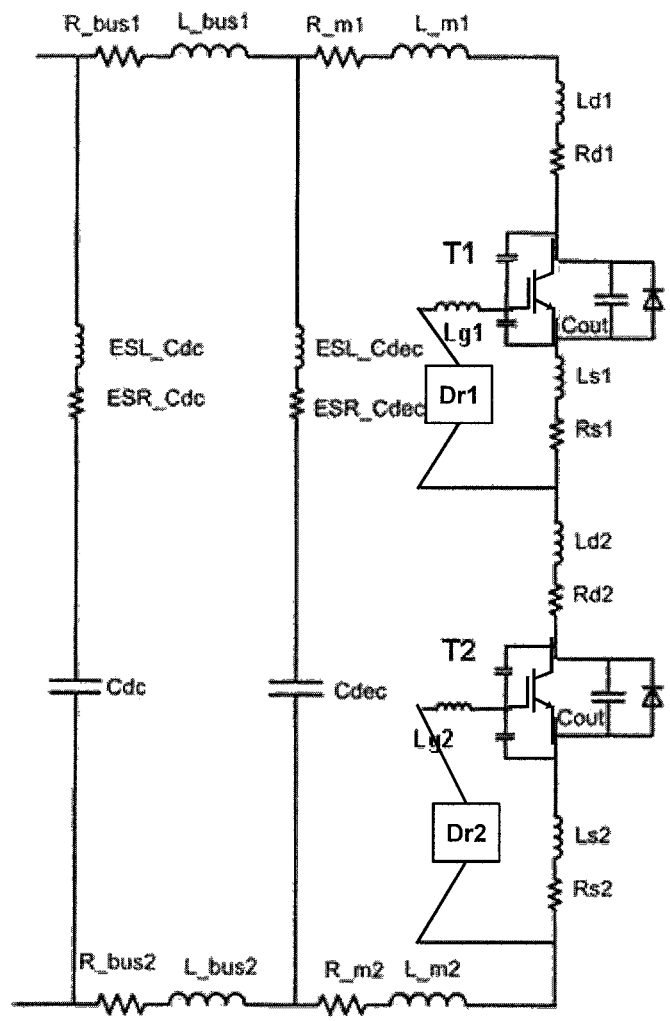
FIG. 8 is a circuit topology of a half-bridge module with parasitic parameters.

The influence on the characteristics of the power module caused by the parasitic parameters due to packaging will be described below using a half-bridge module as an example. FIG. 8 is a circuit topology of a half-bridge module with parasitic parameters. The parasitic inductances Lg1 and Lg2 at gates constitute a part of the driving loop inductances of the power chips T1 and T2, respectively. Larger inductances Lg1 and Lg2 will increase the switching time and switching loss of T1/T2. Lm1 and Lm2 are parasitic inductances between decoupling capacitors and the power chips. Larger Lm1 and Lm2 will increase the voltage surge at the power chips T1 and T2.

Thus, in order to increase the switching speed and reducing loss of the power module, the driving loop is required to be as small as possible, i.e., the connection distance between the control circuit and the power substrate needs to be reduced so as to reduce the parasitic inductances Lg1 and Lg2 at gates. For example, the driving control circuit may be disposed in nearby of a corresponding power device (as shown in FIG. 5D), and the control substrate is disposed in nearby of the gates G1 and G2 of the power devices so as to reduce the parasitic inductances Lg1 and Lg2. In order to reduce the voltage surge of the power device in the power module, a control circuit which includes a decoupling capacitor may be disposed in nearby of the power device, as shown in FIGS. 5A to 5B, or FIG. 6A, and the control substrate 54 may be disposed between two power devices 31 so as to reduce the parasitic inductances Lm1 and Lm2.

In order to further reduce Lg1, Lg2, Lm1, and Lm2 to lower the switching loss and voltage surge of the power devices and thereby to improve the working efficiency and reliability of the power module, the present disclosure proposes the following connection manners between control substrate(s) and power substrate(s), as shown in FIGS. 9A to 9G. It shall be noted that the following connection manners are explained using the control substrate(s) and power substrate(s) in a power module with the integration of a driving control circuit as an example, and the following manners are also applicable for connections between control substrate(s) and power substrate(s) in a power module with the integration of other types of control circuits. The other types of control circuits include but not limited to any one of the above-mentioned control circuits.

Figure 9A:
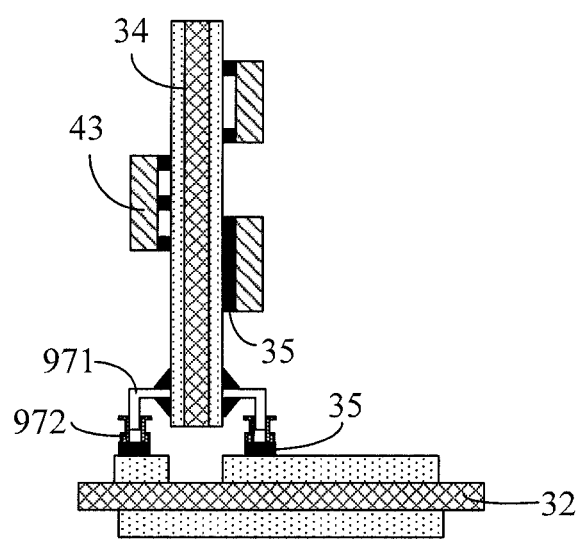
FIGS. 9A to 9G are schematic diagrams showing some connections between a control substrate and a power substrate according to exemplary embodiments, respectively.

As shown in FIG. 9A, a control substrate 34 is connected with a power substrate 32 via a direct insertion terminal 971 and a hollow metal pillar 972. Firstly, the direct insertion terminal 971 is disposed on the control substrate 34 via a bonding material 35, and then the hollow metal pillar 972 is disposed on the power substrate 32 via the bonding material 35, and finally the direct insertion terminal 971 on the control substrate 34 is inserted with an interference fit into the hollow metal pillar 972 on the power substrate 32 so as to realize both mechanical and electrical connections between the control substrate 34 and the power substrate 32. The position of the space in the hollow metal pillar 972 corresponds to the position of the direct insertion terminal 971 on the control substrate 34. The direct insertion terminal 971 may be formed by Cu or an alloy, and the like, and the hollow metal pillar 972 may be formed by Cu, Al, and an alloy, and the like.

The parasitic inductances resulted from the connection distance between the wires of the control substrate 34 and the wires of the power substrate 32 belong to a part of the gate parasitic inductance Lg. By the above connection manner, the wire distance from the vertically disposed control substrate 34 to the horizontally disposed power substrate 32 is very small, and thus a relatively small gate parasitic inductance Lg may be realized.

Figure 9B:
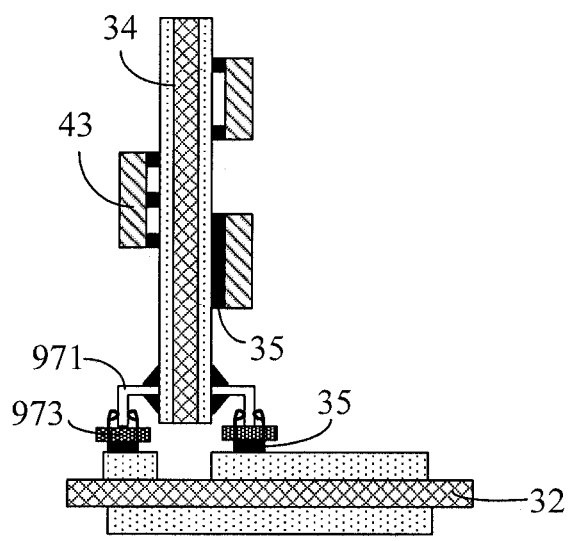

In a connection manner as shown in FIG. 9B, the hollow metal pillar 972 may be replaced with a spring socket 973, and other implementations are the same as that in FIG. 9A, and repeated descriptions are omitted here. The position of the spring socket 973 corresponds to the direct insertion terminal 971 on the control substrate 34, and the direct insertion terminal 971 is inserted with an interference fit into the spring socket 973.

Figure 9C:
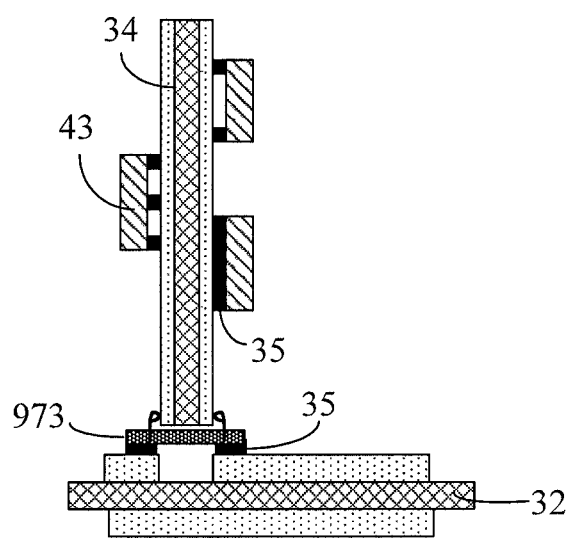

Alternatively, the control substrate 34 may also be directly connected onto the power substrate 32 via the spring pin 973, as shown in FIG. 9C. Firstly, a control device 43 is disposed on the control substrate 34 via the bonding material 35, and then the spring socket 973 is disposed on the power substrate 32 via the bonding material 35, and finally the control substrate 34 is directly inserted with an interference fit into the spring socket 973. The direct insertion terminal is omitted in this structure and thus a further reduced gate inductance Lg may be obtained.

Figure 9D:
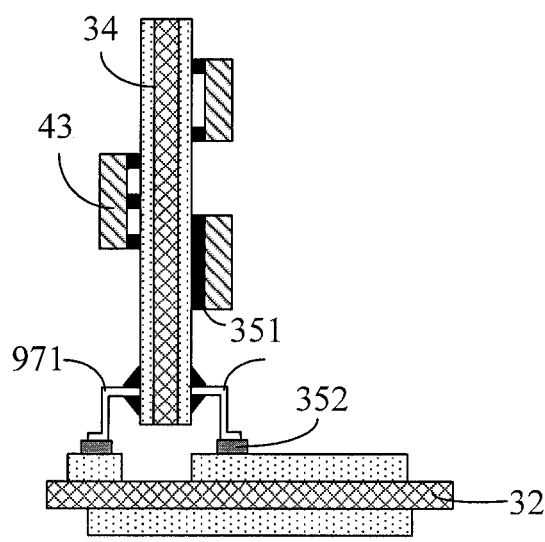

Furthermore, as shown in FIG. 9D, the direct insertion terminal 971 may also be directly connected onto the power substrate 32 to realize connections. Firstly, the power device 43 and the direct insertion terminal 971 are disposed on the control substrate 34 via a high temperature bonding material 351, and then the control substrate 34 with the direct insertion terminal 971 is disposed on the power substrate 32 via a low temperature bonding material 352. This structure can arrive at a smaller Lg as compared with the Lg of the structure as shown in FIG. 9C. This connection structure is set so that the connection temperature for connecting the direct insertion terminal 971 to the power substrate via the low temperature bonding material 352 is lower than the melting point or the glass state temperature of the high temperature bonding material 351.

Figure 9E:
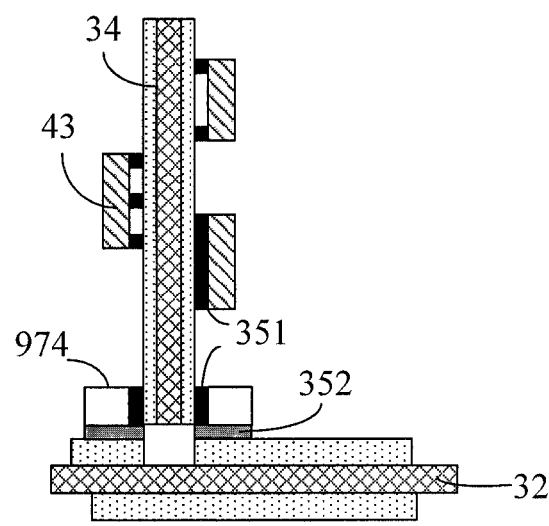
Figure 9F:
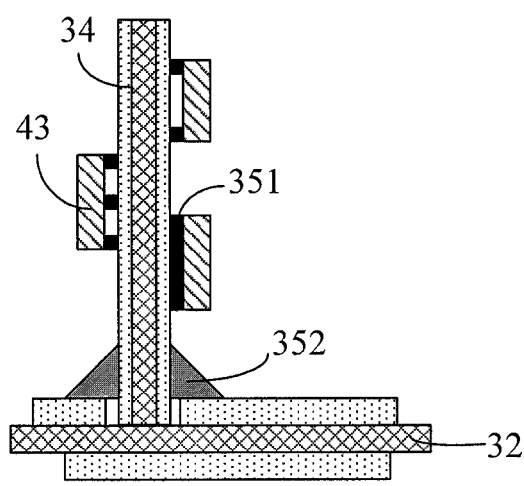

In order to further reduce the gate inductance Lg, the direct insertion terminal 971 may be replaced by a wave soldering pin 974, as shown in FIG. 9E. Alternatively, the wave soldering pin 974 may be omitted, and the control substrate 34 may be directly connected onto the power substrate 32, as shown in FIG. 9F.

Figure 9G:
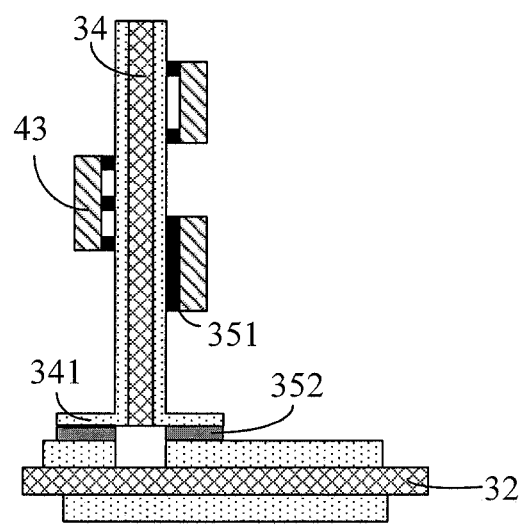

Further, the conductive wiring layer on the control substrate may also be used for connecting the power substrate. As shown in FIG. 9G, firstly, the control device 43 is disposed on the control substrate 34 via the high temperature bonding material 351, and then the bent conductive wiring layers 971 and 343 on the control substrate 34 are disposed on the power substrate 32 via a low temperature bonding material 352. The control substrate 34 is a DBC substrate, and the present disclosure is not limited to this.

It shall be noted that the connection manners between the control substrate 34 and the power substrate 32 as shown in FIGS. 9A to 9G are applicable for multi-layered substrates (two or more conductive layers), and for the connections between control substrate 34 with one conductive layer and the power substrate 32, only the connection manners as shown in FIGS. 9A to 9D may be employed.

The above described connection manners between the control substrate and the power substrate may realize a relatively small connection path. For a power module with the integration of a driving control circuit, these connection manners may reduce the gate parasitic inductances Lg1 and Lg2 and the power loss of the power devices, and thereby improve efficiency. For the power module with the integration of a control circuit which includes a decoupling capacitor, these connection manners may reduce the parasitic inductances Lm1 and Lm2 in the loops and the voltage stress, and thereby improve the reliability of the power module.

Application environments or transporting conditions require that power modules are capable of withstanding vibrations. It exists a failure risk on the connections between the control substrate and the power substrate as there should be a large moment applied on the connections under vibrations due to large distance between the central of the control substrate and the connections. Thus, it is necessary to apply more reliable fixing of the control substrate.

Figure 10:
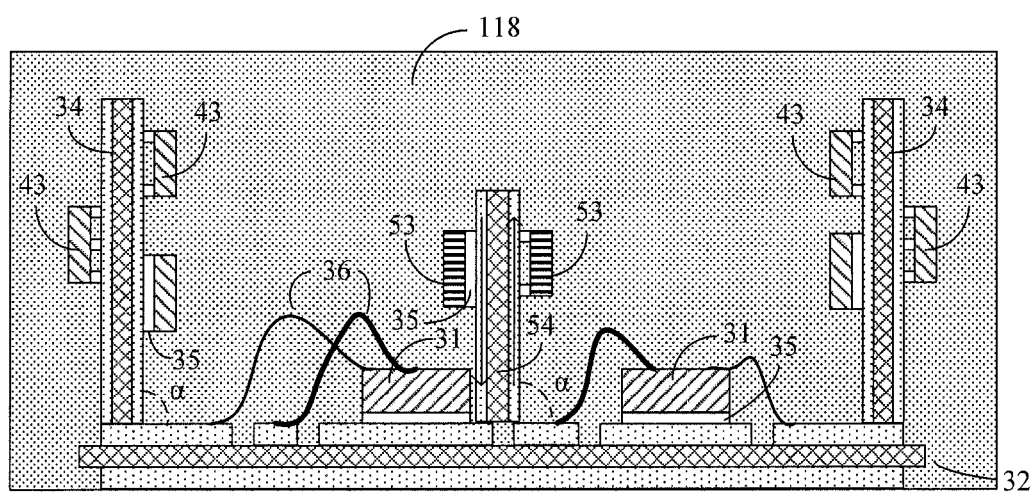
FIG. 10 is a schematic diagram showing a power module having a plastic package structure according to an exemplary embodiment.

FIG. 10 is a schematic diagram showing a power module having a plastic package structure. An encapsulant material 118 is filled in the power module having a plastic package structure. Since the encapsulant material 118 has good mechanical strength to provide sufficient mechanical support for the control substrate, no additional mechanical structures are needed to fix the control substrate.

Figure 11A:
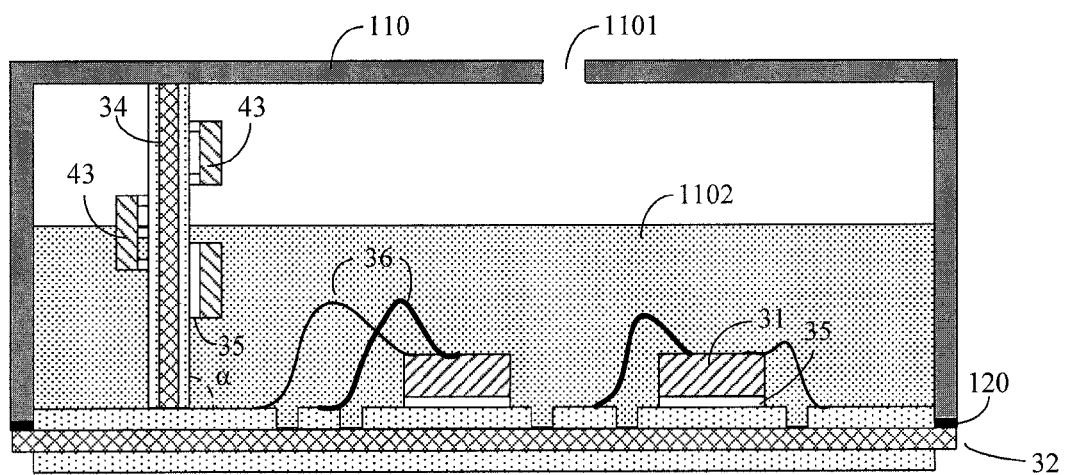
FIGS. 11A and 11B are side and top views of a power module having a housing on which a mounting groove is provided according to an exemplary embodiment, respectively.
Figure 11B:
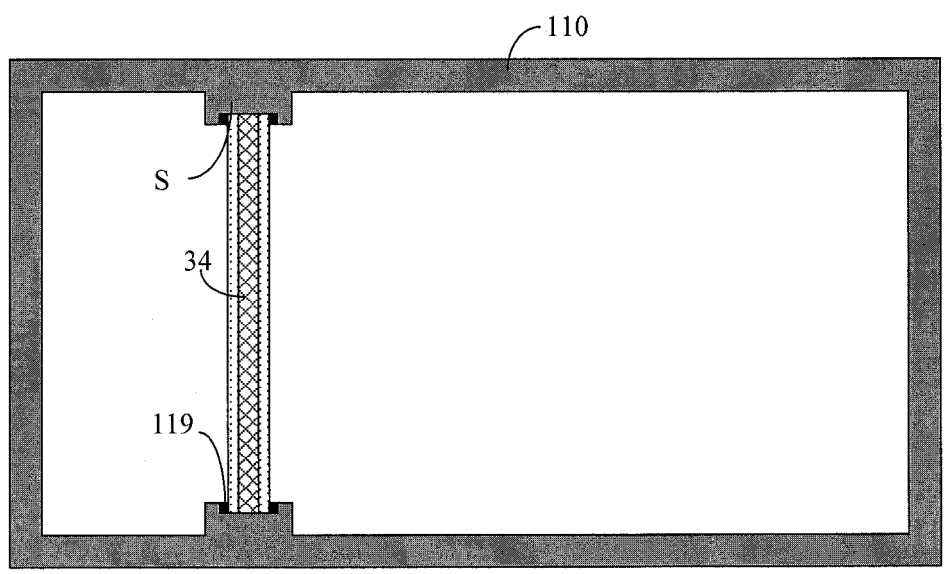

For a power module packaged with a housing, a mounting groove for the control substrate may be provided on the housing. FIGS. 11A and 11B are side view and top view of a power module with a housing on which a mounting groove is provided according to an exemplary embodiment. For convenience in description, only the mounting groove S and the adhesive material 119 on the housing 110 and the control substrate 34 are illustrated in the top view in FIG. 11B. FIGS. 11A and 11B show a power module with the integration of a driving control circuit, and the present disclosure is not limited to this. The structure includes a control substrate 34, a power substrate 32, a housing 110 having a mounting groove S, an sealing material 120 and an adhesive material 119. Firstly, the adhesive material 119 is coated at a side edge of the control substrate 34, i.e., the portion in contact with the mounting groove S, and then the sealing material 120 is coated at the bottom of the housing 110 which is in contact with the power substrate 32, and finally, the mounting groove S of the housing 110 is disposed directly above the control substrate 34 to mount the control substrate 34 from top to bottom, and thus the control substrate 34 is inserted into the mounting groove S. Then, the sealing material 120 and the adhesive material 119 are cured to fix the side surface of the control substrate 34 so as to improve the mechanical stabilization of the control substrate 34.

The adhesive material 119 and sealing material 120 may be organic silicon resin, vulcanizing silicone rubber, or epoxy resin, and the like. Also, fillers may also be added into the adhesive material 119 and sealing material 120 to adjust the physical properties. The internal fillers may include quartz, aluminium oxide, aluminium hydroxide, zinc oxide, and boron nitride, and so on. The adhesive material is required to have an adhesive strength greater than 100 Pa and a hardness above Shore A10 after curing.

Further, at least a small hole 1101 may be provided on the housing 110 for introducing a terminal or dispensing. In the interior of the power module, encapsulant material 1102 such as organic silicone gel may also be filled to further fix and protect the internal devices.

Figure 12A:
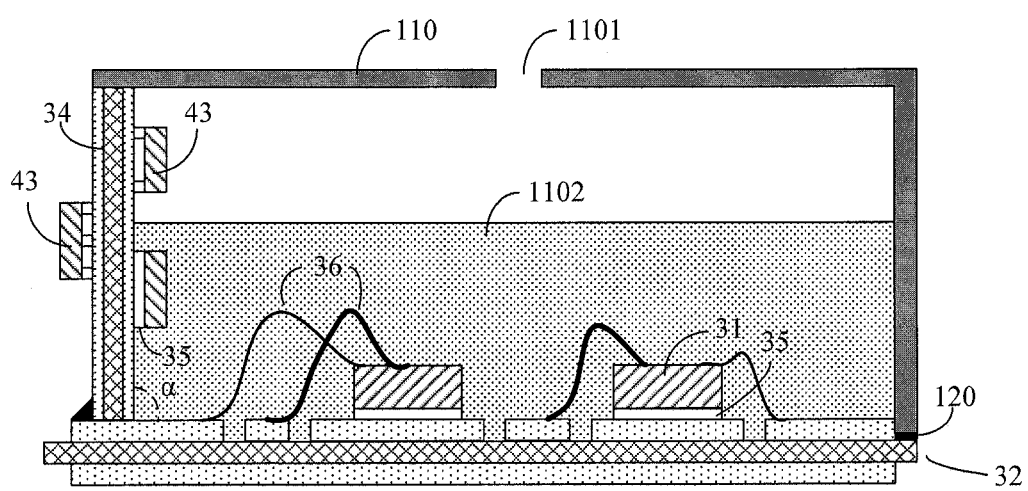
FIGS. 12A and 12B are side and top views of a power module in which a control substrate serves as a part of a housing according to an exemplary embodiment.
Figure 12B:
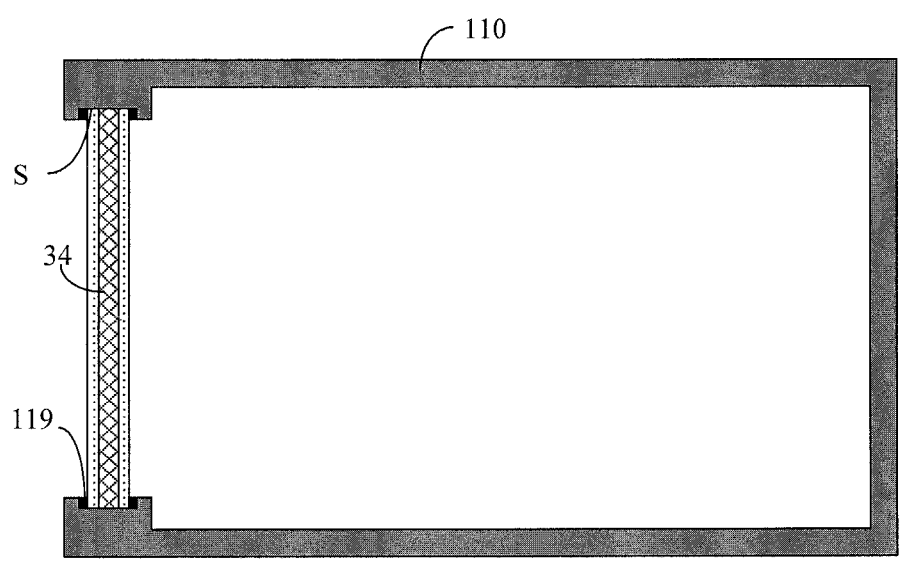

The control substrate also may serve as a part of the housing. FIGS. 12A and 12B are side view and top view of a power module in which a control substrate servers as a part of a housing of a power module according to an exemplary embodiment. Similarly, for convenience in description, only the mounting groove S and the adhesive material 119 on the housing 110 and the control substrate 34 are illustrated in the top view in FIG. 12B. FIGS. 12A and 12B show a power module with the integration of a driving control circuit, and the present disclosure is not limited to this. As shown in FIGS. 12A and 12B, the adhesive material 119 needs to be coated on the side edge of the control substrate 34 which is in contact of the mounting groove S, and the sealing material 120 also needs to be coated on the connection portion of the control substrate 34 and the power substrate 32 so as to ensure that the organic silicone gel 1102 for protecting the power chips will not leak from the housing.

Similarly, at least one small hole 1101 may be provided on the housing 110 for introducing a terminal or dispensing.

Figure 13A:
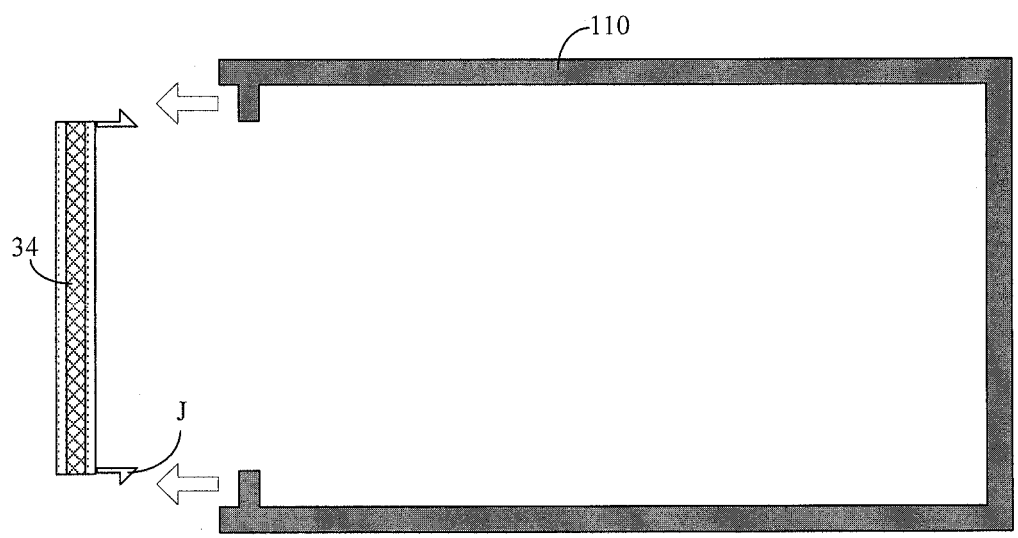
FIGS. 13A and 13B are side and top views of a power module having a flexible buckle under two states according to an exemplary embodiment.
Figure 13B:
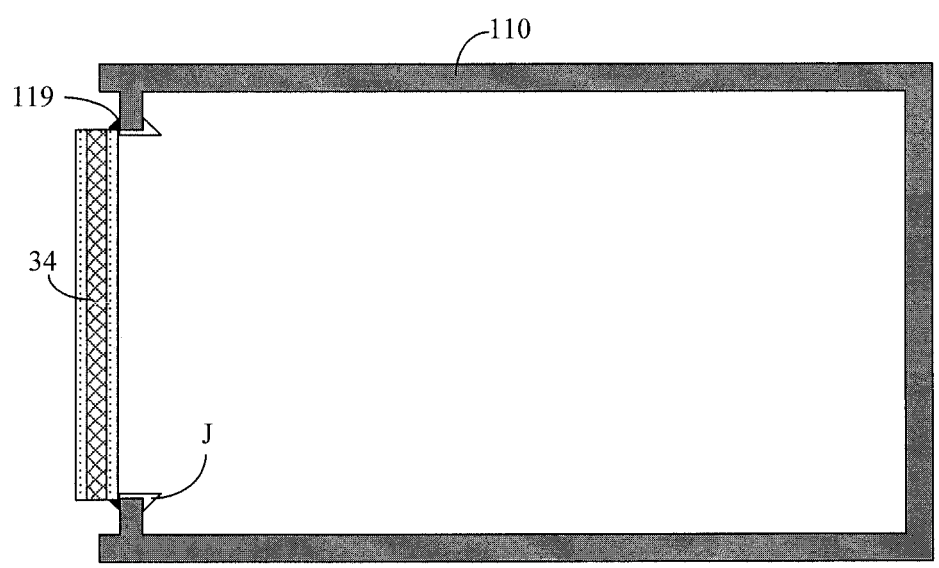

In addition to providing the mounting groove on the housing, a flexible buckle may be disposed on the control substrate. FIGS. 13A and 13B are top views showing a power module with a flexible buckle under two statuses according to an exemplary embodiment. Similarly, for convenience in description, the top views in FIGS. 13A and 13B only illustrate a control substrate 34, a flexible buckle J, a housing 110 and an adhesive material 119. Unlike the mounting manner of the power module as shown in FIGS. 11A and 11B, the housing 110 is pushed towards the control substrate 34 having the flexible buckle J from left to right, and then is engaged with the control substrate 34 via the flexible buckle J. Further, the flexible buckle J may be provided on the housing 110 (not shown).

The exemplary embodiments of the present disclosure are described above in detail. It shall be appreciated that the present disclosure is not limited to the disclosed embodiments, and instead the present disclosure is intended to encompass various modifications and equivalent substitutions within the scope as defined by the appended claims.

What is claimed is:

1. A power module with the integration of a control circuit, comprising:
    a power substrate;
    a power device mounted on the power substrate; and
    at least one control substrate which supports the control circuit, is electrically connected with the power substrate and disposed at an angle of inclination on a surface of the power substrate on which the power device is mounted;
    wherein the angle of inclination is greater than or equal to 45 degrees and smaller than or equal to 135 degrees;
    wherein the at least one control substrate comprises two conductive wiring layers and one insulation layer, the two conductive wiring layers are disposed on both surfaces of the one insulation layer, respectively, and current through the two conductive wiring layers flows oppositely so as to form an inverse coupling electromagnetic field.

2. The power module according to claim 1, wherein the power substrate comprises at least one conductive wiring layer on which the power device is disposed.

3. The power module according to claim 1, wherein a control device in the control circuit is disposed on the conductive wiring layers.

4. The power module according to claim 1, wherein each of the conductive wiring layers has a thickness greater than or equal to 5 micrometers and smaller than or equal to 2 millimeters.

5. The power module according to claim 1, wherein the insulation layer has a thickness greater than or equal to 5 micrometers and smaller than or equal to 2 millimeters.

6. The power module according to claim 1, wherein the conductive wiring layers of the at least one control substrate comprise a bending portion in parallel with the power substrate, and the bending portion is electrically connected with and fixed onto the power substrate via a bonding material.

7. The power module according to claim 1, wherein the at least one control substrate is vertically disposed on the surface of the power substrate on which the power device is mounted.

8. The power module according to claim 1, further comprising:

a housing covering the surface of the power substrate on which the power device is mounted, and having an engagement mechanism disposed on the housing for engaging with the at least one control substrate.

9. The power module according to claim 8, wherein a portion on the at least one control substrate which is in contact with the at least one engagement mechanism is coated with an adhesive material, and a portion of the housing which is in contact with the power substrate is coated with a sealing material.

10. The power module according to claim 8, wherein the at least one engagement mechanism comprises a mounting groove or a flexible buckle.

\* \* \* \* \*